(12) United States Patent
Chern et al.

(10) Patent No.: US 10,133,078 B2
(45) Date of Patent: *Nov. 20, 2018

(54) APPARATUS OF STRUCTURED LIGHT GENERATION

(71) Applicant: EVERREADY PRECISION IND. CORP., Kaohsiung (TW)

(72) Inventors: Jyh-Long Chern, Taipei (TW); Chih-Ming Yen, New Taipei (TW)

(73) Assignee: EVERREADY PRECISION IND. CORP., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/647,655

(22) Filed: Jul. 12, 2017

(65) Prior Publication Data

US 2017/0307897 A1    Oct. 26, 2017

Related U.S. Application Data

(60) Division of application No. 15/071,935, filed on Mar. 16, 2016, which is a continuation-in-part of
(Continued)

(30) Foreign Application Priority Data

| Oct. 31, 2014 | (TW) | ............ | 103137850 A |
| Oct. 31, 2014 | (TW) | ............ | 103137857 A |
| Oct. 31, 2014 | (TW) | ............ | 103219360 U |

(51) Int. Cl.
| *G02B 1/00* | (2006.01) |
| *G02B 27/09* | (2006.01) |
| *G02B 3/04* | (2006.01) |
| *G01B 11/25* | (2006.01) |
| *G02B 3/00* | (2006.01) |

| *G02B 27/42* | (2006.01) |
| *G02B 19/00* | (2006.01) |
(Continued)

(52) U.S. Cl.
CPC .......... *G02B 27/0944* (2013.01); *G01B 11/25* (2013.01); *G02B 3/0056* (2013.01); *G02B 3/04* (2013.01); *G02B 19/0052* (2013.01); *G02B 27/425* (2013.01); *H01S 5/02288* (2013.01); *H01S 5/005* (2013.01); *H01S 5/02212* (2013.01)

(58) Field of Classification Search
CPC .. G02B 3/04; G02B 27/0961; G02B 27/0927; G02B 27/0944; G02B 27/0006; G02B 3/0056; G02B 19/0052; G02B 27/425; G01B 11/25; H01S 5/02288
USPC ........................................................ 359/507
See application file for complete search history.

(56) References Cited

U.S. PATENT DOCUMENTS

| 4,426,155 A | 1/1984 | Monchalin |
| 5,016,149 A | 5/1991 | Tanaka et al. |
(Continued)

*Primary Examiner* — Euncha Cherry
(74) *Attorney, Agent, or Firm* — Muncy, Geissler, Olds & Lowe, P.C.

(57) ABSTRACT

An apparatus of structured light generation is equipped with a light source and a lens unit. The lens unit is installed in a compact housing of the apparatus of structured light generation. Moreover, the lens unit constructed two different optical path lengths within the housing. By the lens unit, light beams from the light source are collimated and converted into linear light beams. The linear light beams are locally overlapped or globally overlapped. Consequently, the light beam from the light source is shaped into a linear structured light or a linearly-overlapped structured light for detection.

8 Claims, 8 Drawing Sheets

Related U.S. Application Data application No. 14/595,651, filed on Jan. 13, 2015, now Pat. No. 9,322,962.

(51) Int. Cl.
    *H01S 5/00*     (2006.01)
    *H01S 5/022*     (2006.01)

(56) References Cited

U.S. PATENT DOCUMENTS

| | | |
|---|---|---|
| 5,313,315 A | 5/1994 | Feinberg et al. |
| 5,995,526 A | 11/1999 | Yan et al. |
| 6,243,200 B1 | 6/2001 | Zhou et al. |
| 8,750,671 B1 | 6/2014 | Kelly et al. |
| 2003/0080099 A1 | 5/2003 | Tanaka et al. |
| 2005/0025026 A1 | 2/2005 | Hirai |
| 2005/0047141 A1 | 3/2005 | Takezawa |
| 2006/0055939 A1 | 3/2006 | Akiba et al. |
| 2006/0152787 A1 | 7/2006 | Knebel et al. |
| 2006/0171035 A1 | 8/2006 | Berman et al. |
| 2008/0198389 A1 | 8/2008 | Yoo et al. |
| 2009/0207868 A1 | 8/2009 | Barnes et al. |
| 2010/0214652 A1 | 8/2010 | Gollier |
| 2010/0232806 A1 | 9/2010 | Kagaya et al. |
| 2010/0254020 A1 | 10/2010 | Govyadinov et al. |
| 2011/0170172 A1 | 7/2011 | Mizushima et al. |
| 2011/0261014 A1 | 10/2011 | Chen et al. |
| 2011/0291991 A1 | 12/2011 | Lin |
| 2013/0077457 A1 | 3/2013 | Usui et al. |
| 2014/0168780 A1 | 6/2014 | Lee et al. |

APPARATUS OF STRUCTURED LIGHT GENERATION

CROSS-REFERENCE TO RELATED APPLICATION

This application is a Divisional of co-pending continuation-in-part application Ser. No. 15/071,935, filed on Mar. 16, 2016, which claims priority of U.S. application Ser. No. 14/595,651, filed January 13, 2015, now U.S. Pat. No. 9,322,962, for which priority is claimed under 35 U.S.C. § 120; and this application claims priority of Application Nos. 1036137857, 103219360, 103137850 filed in Taiwan on Oct. 31, 2014 under 35 U.S.C. § 119; the entire contents of all of which are hereby incorporated by reference.

FIELD OF THE INVENTION

The present invention relates to an apparatus of structured light generation, and more particularly to a slim-type apparatus of structured light generation.

BACKGROUND OF THE INVENTION

In recent years, the elements, devices, modules, apparatuses or instruments for detecting interactive gestures, postures or 3D scanning trajectories have been increasingly developed. For example, an infrared (IR) structured light can be employed to achieve the above detecting function. In the meantime, a planar scanning structured light is also preferred to employ in recognizing the interactive actions or the important indicating objects. In practical implementation, a collimating beam is required in the generation mechanism to make such a structured light. As a result, a collimated infrared light is necessary to achieve this function. However, since the current light source module with the function of generating the collimated light has bulky volume, this light source module cannot meet the requirements of the modern slim type mobile phone, wearable devices, and so on.

On the other hand, the current light source module is usually equipped with a dust-proof lens at a side of a housing thereof. The dust-proof lens can increase the resistance of the light source to the harsh environment and enhance the stability of the light source. The material of the dust-proof lens is typically a glass plate. In some situations, the dust-proof lens may be omitted or integrated into other part. However, if the dust-proof lens is omitted, the optical path length or the working distance is possibly changed. The change of the optical path length or the working distance may adversely affect the operation of the light source module, i.e., the effective back focal length is changed and the collimating property is varied. Therefore, it is important to develop a lens which is capable to work well both with/or without the dust-proof lens and install it in a compact-size and user-friendly apparatus of structured light generation in a mobile phone so as to extract 3D information or achieve the 3D gesture or scanning function.

SUMMARY OF THE INVENTION

An object of the present invention provides an apparatus of structured light generation for achieving a 3D sensing function. The apparatus of structured light generation uses a lens unit to construct at least two optical path lengths. Consequently, the flexibility of using the apparatus of structured light generation is enhanced.

Another object of the present invention provides an apparatus of structured light generation comprising a lens unit with a lens element. The lens element has a first surface for collimating a visible or invisible laser beam and a second surface for shaping the collimated laser beam as a linear light beam. Consequently, the parallel linear light beam is generated.

In accordance with an aspect of the present invention, an apparatus of structured light generation is provided. The apparatus of structured light generation includes a light source, a lens unit and a housing. The light source emits a light beam. The lens unit converts the light beam into a linear light beam. The lens unit includes a lens element with a first surface and a second surface. The first surface and the second surface are opposed to each other. The first surface faces the light source. In addition, the first surface has a radius larger than 0.189 mm or has a diffracting function. The housing accommodates the light source and the lens unit. Within the housing, the lens unit constructs a first optical path length and a second optical path length for the light beam. The first optical path length and the second optical path length are different.

In an embodiment, the first surface of the lens element is an aspheric surface or a free-form surface, and a lenticular lens array structure is formed on the second surface of the lens element. Alternatively, a lenticular lens array structure is formed on the first surface of the lens element, and the second surface of the lens element is an aspheric surface or a free-form surface.

In an embodiment, the lens unit further includes a dust-proof plate between the light source and the lens element, and the lens element and the dust-proof plate are made of an identical material or different materials. In this circumstance, the materials can be glass or non-glass type.

In an embodiment, the lens unit further includes a mixed type optical structure. The mixed type optical structure contains a diffractive structure, a reflective structure and/or a refractive structure. The mixed type optical structure is arranged between the light source and the lens element.

In an embodiment, the first surface of the lens element has a phase distribution given by a formula:

$$\phi(r) = dor\frac{2\pi}{\lambda_0}(df0 + df1r^2 + df2r^4 + df3r^6 + df4r^8 + \cdots)$$

where, $r^2 = x^2 + y^2$,
wherein $\phi(r)$ is the phase distribution, r is the distance between any point and a center of the first surface, and x and y are two coordinates of two axes vertical to an optical axis or a Z axis, wherein dor=1, df0=0.0, df1=−6.1691×10^(−1), df2=2.8442×10^1, df3=−4.8405×10^3, df4=2.800×10^5, df5=4.6892×10^(−2), df6=3.1385×10^(−4), and the lens element with the aspheric surface has an effective focal length smaller than 1.2 mm.

In an embodiment, the light beam is collimated by the first surface of the lens element, and the collimated light beam is converted into the linear light beam by the second surface of the lens element.

In an embodiment, the lens unit further includes a dust-proof plate between the light source and the lens element. The lens element and the dust-proof plate are made of an identical material or different materials. The lens element is made of poly(methyl methacrylate), polycarbonate, cycloolefin polymer or high density polyethylene, which is transparent in a corresponding wavelength range.

In an embodiment, the first surface of the lens element has an aspheric surface, a lenticular lens array structure is formed on the second surface of the lens element, and a surface profile of the aspheric surface is given by a following formula:

$$z = \frac{cvr^2}{1+\sqrt{1-cv^2(cc+1)r^2}} + as0 + as1r^2 + as2r^4 + as3r^6 + as4r^8 + as5r^{10} + as6r^{12} + \ldots$$

wherein z is a Z-axis coordinate of a specified point on the aspheric surface from a vertex, CV is a radius of curvature, CC is a conic coefficient, as0=as1=0.0, as2=9.6037×10^1, as3=−4.1955×10^3, as4=−2.5357×10^4, as5=−7.2472×10^1, and as6=−3.0699.

In an embodiment, the first surface of the lens element is a flat surface with the diffracting function, and the first surface has a phase distribution given by a formula:

$$\phi(r) = dor\frac{2\pi}{\lambda_0}(df0 + df1r^2 + df2r^4 + df3r^6 + df4r^8 + \cdots)$$

where, $r^2 = x^2 + y^2$,
wherein $\phi(r)$ is the phase distribution, r is the distance between any point and a center of the first surface, and x and y are two coordinates of two axes vertical to an optical axis or a Z axis, wherein dor=1, df0=0.0, df1=−6.1691×10^(−1), df2=2.8442×10^1, df3=−4.8405×10^3, df4=2.800×10^5, df5=4.6892×10^(−2), and df6=3.1385×10^(−4).

In an embodiment, a lenticular lens array structure is formed on the first surface of the lens element, the second surface of the lens element has an aspheric surface, and a surface profile of the aspheric surface is given by a following formula:

$$z = \frac{cvr^2}{1+\sqrt{1-cv^2(cc+1)r^2}} + as0 + as1r^2 + as2r^4 + as3r^6 + as4r^8 + as5r^{10} + as6r^{12} + \ldots$$

wherein z is a Z-axis coordinate of a specified point on the aspheric surface from a vertex, CV is a radius of curvature, CC is a conic coefficient, as0=as1=0.0, as2=9.6037×10^1, as3=−4.1955×10^3, as4=−2.5357×10^4, as5=−7.2472×10^1, and as6=−3.0699.

In an embodiment, the first optical path length or the second optical path length comprises one or plural working distances. Moreover, a difference between the plural working distances is smaller than 1.2 mm.

In an embodiment, the light source includes plural light-emitting chips, and the lens element includes plural light-transmissible regions. After the light beam from each of the light-emitting chips passes through the corresponding light-transmissible region of the lens element, the light beam is converted into at least one linear light beam by the corresponding light-transmissible region. The linear light beams outputted from the plural light-transmissible regions are locally overlapped, globally overlapped, or not overlapped.

In accordance with another aspect of the present invention, an apparatus of structured light generation is provided. The apparatus of structured light generation includes a light source, a lens unit and a housing. The light source emits a light beam. The lens unit converts the light beam into a linear light beam. The housing accommodates the light source and the lens unit. The housing includes a first side and a second side. The first side and the second side are opposed to each other and open to an outside of the casing. A distance between the first side and the second side is not larger than 4 mm. The light source is located near the first side. The lens unit is located near the second side. Within the housing, the lens unit constructs a first optical path length and a second optical path length for the light beam. Moreover, the first optical path length and the second optical path length are different.

In an embodiment, the lens unit includes a lens element, and a radius of a first surface of the lens element is larger than 0.189 mm. The first surface faces the light source. The first surface is an aspheric surface or has a lenticular lens array structure. The first surface has an effective focal length smaller than 1.2 mm.

In an embodiment, a second surface of the lens element is an aspheric surface or has a lenticular lens array structure, and the second surface of the lens unit is close to the second side of the housing and faces the outside of the housing.

In an embodiment, the lens unit further includes a dust-proof plate between the light source and the lens element.

In an embodiment, the lens unit includes a lens element. A first surface of the lens element is a flat surface with a diffracting function. The first surface has a phase distribution given by a formula:

$$\phi(r) = dor\frac{2\pi}{\lambda_0}(df0 + df1r^2 + df2r^4 + df3r^6 + df4r^8 + \cdots)$$

where, $r^2 = x^2 + y^2$,
wherein $\phi(r)$ is the phase distribution, r is the distance between any point and a center of the first surface, and x and y are two coordinates of two axes vertical to an optical axis or a Z axis, wherein dor=1, df0=0.0, df1=−6.1691×10^(−1), df2=2.8442×10^1, df3=−4.8405×10^3, df4=2.800×10^5, df5=4.6892×10^(−2), and df6=3.1385×10^(−4).

In an embodiment, the light source includes plural light-emitting chips, and the lens element includes plural light-transmissible regions. After the light beam from each of the light-emitting chips passes through the corresponding light-transmissible region of the lens element, the light beam is converted into at least one linear light beam by the corresponding light-transmissible region. The linear light beams outputted from the plural light-transmissible regions are locally overlapped, globally overlapped, or not overlapped.

In an embodiment, the plural light-emitting chips are programmed to be individually turned on or turned off in identical or different time segments.

In an embodiment, the light source includes one light-emitting chip, or the light source includes plural light-emitting chips that are distributed on a curvy substrate.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
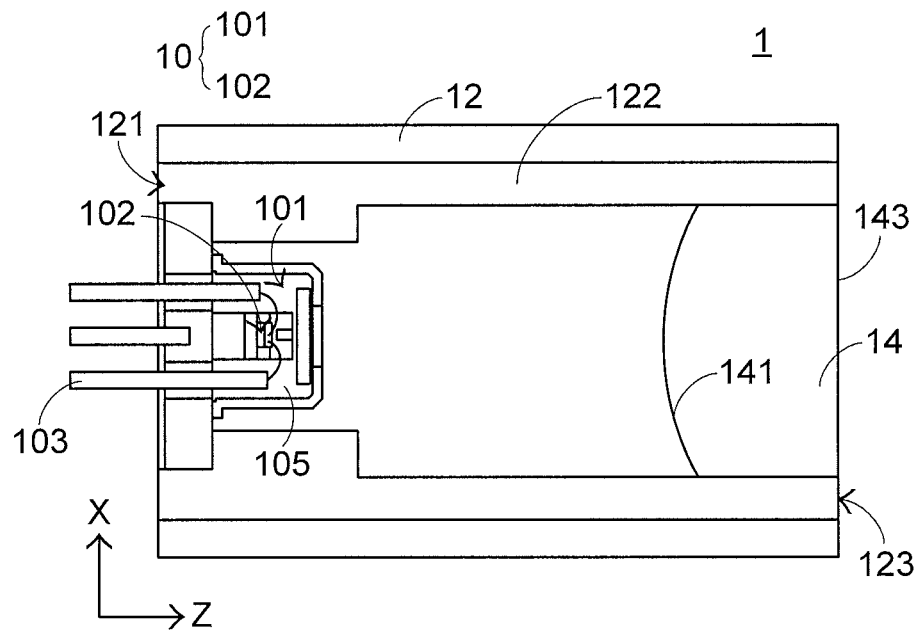
FIG. 1 is a schematic cross-sectional side view illustrating an apparatus of structured light generation according to a first embodiment of the present invention.

FIG. 1 is a schematic cross-sectional side view illustrating an apparatus of structured light generation according to a first embodiment of the present invention. As shown in FIG. 1, the apparatus of structured light generation 1 includes a light source 10, a housing 12 and a lens unit 14. The housing 12 provides an accommodation space for accommodating the light source 10 and the lens unit 14. An example of the light source 10 includes but is not limited to a laser diode (LD), a light emitting diode (LED), an organic light emitting diode (OLED) or a thermal source. Generally, the housing 12 is opaque. The housing 12 includes a first side 121, a second side 123 and a fixing structure 122. The first side 121 and the second side 123 are opposed to each other. The fixing structure 122 is disposed within the housing 12. In this embodiment, the fixing structure 122 is used for fixing the light source 10 at the first side 121 and fixing the lens unit 14 at the second side 123. It is noted that the functions of the fixing structure 122 are not restricted. The fixing structure 122 may be a one-piece structure or an assembled structure. Moreover, the fixing structure 122 may be installed within the housing 12 or directly integrated with the housing 12. Moreover, the housing 12 is designed to have a compact size, and thus the apparatus of structured light generation 1 of the present invention is suitably applied to a camera phone. For example, each of the first side 121 and the second side 123 has a dimension of 4-6 mm×6 mm, and the distance between the first side 121 and the second side 123 is about 2.5-7 mm, and preferably 4.0 mm Moreover, the shapes of the first side 121 and the second side 123 are not restricted to square shapes or circular shapes.

The light source 10 includes one or plural light-emitting chips 102 and a package structure 101. For example, the light-emitting chip 102 may emit an infrared laser beam with a wavelength of 830 nm and a diffusion angle of about 20 degrees. In addition, the light-emitting chip 102 is packaged by the package structure 101. The number of the one or plural light-emitting chips 102 packaged within the package structure 101 is not restricted. In an embodiment, plural light-emitting chips 102 are firstly distributed on different positions of a substrate and then covered by the package structure 101. For clarification and brevity, only a single light-emitting chip 102 is shown in FIG. 1. An example of the package structure 101 includes but is not limited to a CAN package structure, a DIP package structure, a QFP package structure or a surface mount device. Basically, the package structure 101 includes a main body 105 and one or plural pins 103. The one or plural pins 103 are protruded out of the main body 105 or disposed on a surface of the main body 105. As shown in FIG. 1, the pins 103 are protruded out of the housing 12 in a direction vertical to the first side 121. The thickness of the main body 105 in the direction vertical to the first side 121 is approximately not larger than 1 mm. It is noted that the thickness of the main body 105 is not restricted. Moreover, the light source 10 may generate an emitting pattern of symmetrical circular light spots or asymmetrical elliptic light spots. In other words, the lens unit 14 of the present invention can be applied to the light source 10 that generates the symmetric or asymmetric emitting pattern.

In this embodiment, the lens unit 14 includes a lens element, wherein a numerical aperture of the lens element is larger than 0.1 and less than 0.5, preferably about 0.2. The lens element includes a first surface 141 and a second surface 143. The first surface 141 is a curvy surface with a curvature of radius larger than 0.189 mm. The second surface 143 has another optical structure. The first surface 141 faces the light source 10 (or the first side 121 of the housing 12), and the second surface 143 faces the second side 123 of the housing 12. The distance between the first surface 141 of the lens element and the light source 10 is about 1.00 mm. The light source 10 may emit a light beam. The lens unit 14 constructs a first optical path length for the light beam. Moreover, the first surface 141 of the lens element is an aspheric surface or a free-form surface for collimating the light beam from the light source 10. Preferably, the radius of the first surface 141 is in the range between 0.18935 and 0.1894 mm. The surface profile of the aspheric surface may be expressed by the Z-axis coordinate of a specified point on the aspheric surface. The Z axis is in parallel with the optical axis. In particular, the surface profile of the aspheric surface may be given by the following formula:

$$z = \frac{cvr^2}{1 + \sqrt{1 - cv^2(cc+1)r^2}} + as0 + as1r^2 + as2r^4 + as3r^6 + as4r^8 + as5r^{10} + as6r^{12} + \ldots$$

In the above formula, z is the Z-axis coordinate of a specified point on the aspheric surface from the vertex, CV is the radius of curvature, CC is the conic coefficient, (asn) indicate the aspheric coefficients corresponding to different order terms of radius, wherein n indicates 0 or a positive integer. For example, as0=as1=0.0, as2=9.6037 ×10^1, as3=−4.1955×10^3, as4=−2.5357×10^4, as5=−7.2472×10^1, and as6=−3.0699. It is noted that the aspheric coefficients are not limited thereto. Moreover, the effective focal length of the lens element is preferably smaller than 1.2 mm, and more preferably smaller than 1.0 mm. The lens element is made of poly(methyl methacrylate) (PMMA) or any other appropriate transparent material in a corresponding wavelength range. For example, the transparent material is polycarbonate (PC), cyclo-olefin polymer (COP resin) or high density polyethylene (HDPE).

Figure 2:
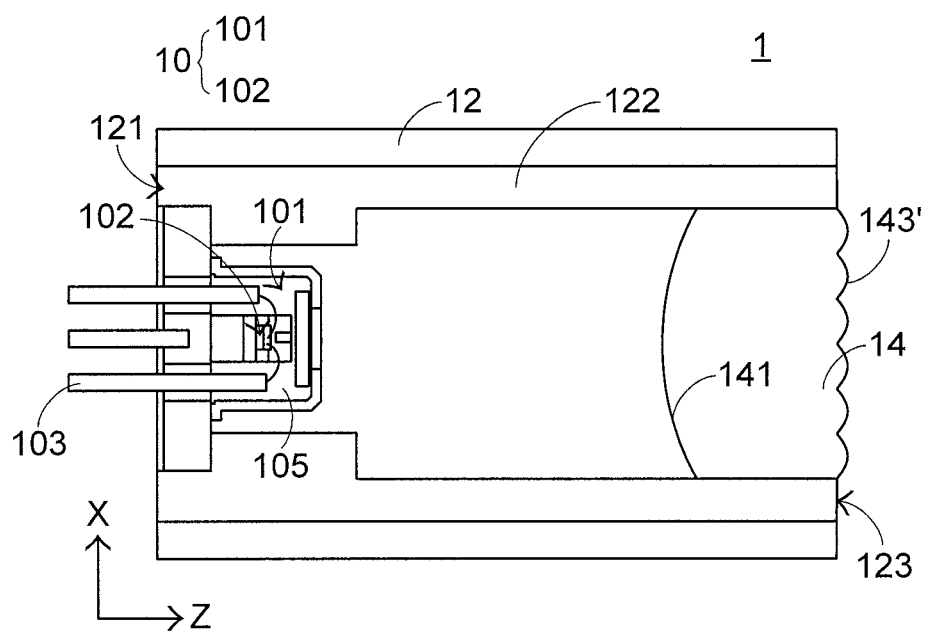
FIG. 2 is a schematic cross-sectional side view illustrating a variant example of the apparatus of structured light generation according to the first embodiment of the present invention.
Figure 3:
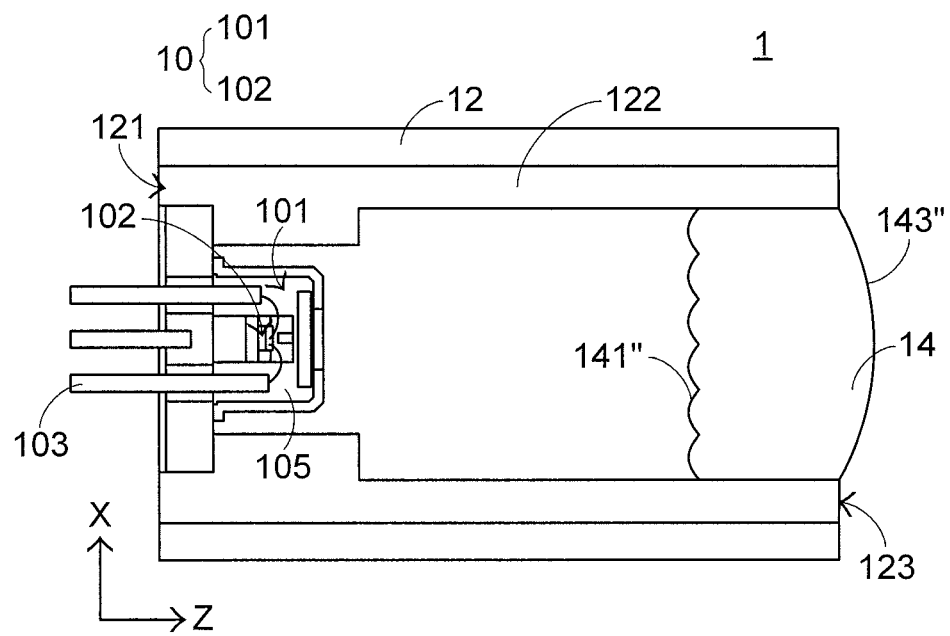
FIG. 3 is a schematic cross-sectional side view illustrating another variant example of the apparatus of structured light generation according to the first embodiment of the present invention.

In this embodiment, after the collimated light beam is converted into a linear light beam by the second surface 143 of the lens element, a structured light is outputted from the apparatus of structured light generation 1. It is noted that numerous modifications and alterations may be made while retaining the teachings of the invention. FIG. 2 is a schematic cross-sectional side view illustrating a variant example of the apparatus of structured light generation according to the first embodiment of the present invention. As shown in FIG. 2, a lenticular lens array structure is formed on the second surface 143' of the lens element, wherein the curvature of the lenticular lens array structure is −64 degrees in the X-axis direction vertical to optical axis. Alternatively, the profiles of the first surface and the second surface of the lens element may be exchanged. FIG. 3 is a schematic cross-sectional side view illustrating another variant example of the apparatus of structured light generation according to the first embodiment of the present invention. As shown in FIG. 3, a lenticular lens array structure is formed on the first surface 141" of the lens element, and the second surface 143" of the lens element is an aspheric surface or a free-form surface. Preferably, the overall thickness of the lens element is not larger than 1.2 mm. Consequently, the thickness of the housing in the Z-axis direction or the optical axis direction is not larger than 4 mm. Under this circumstance, the apparatus of structured light generation 1 can meet the requirement of slimness.

Figure 4:
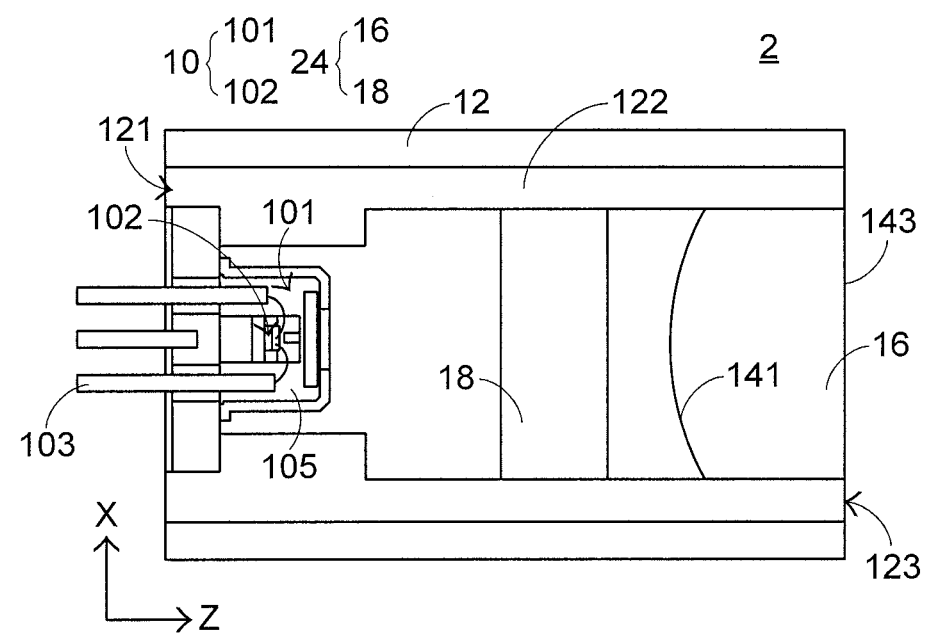
FIG. 4 is a schematic cross-sectional side view illustrating an apparatus of structured light generation according to a second embodiment of the present invention.

FIG. 4 is a schematic cross-sectional side view illustrating an apparatus of structured light generation according to a second embodiment of the present invention. As shown in FIG. 4, the lens unit 24 of the apparatus of structured light generation 2 includes a lens element 16 and a dust-proof plate 18. The lens element 16 of this embodiment is equivalent to the lens unit 14 of the first embodiment. In comparison with the first embodiment, the dust-proof plate 18 is additionally installed in the housing 12 of the apparatus of structured light generation 2 of this embodiment. The dust-proof plate is used to prevent external dust or foreign matter from entering the light source 10, which is made of glass or non-glass material. Moreover, the arrangement of the dust-proof plate 18 can increase the resistance of the light source 18 to the harsh environment and enhance the stability of the light source 10. In an embodiment, the dust-proof plate 18 is made of a BK7 material, the thickness of the dust-proof plate 18 is about 0.25 mm, and the distance of the dust-proof plate 18 from the light source 10 is about 0.5 mm. It is noted that the material, thickness and distance of the dust-proof plate 18 are not restricted. In another embodiment, the dust-proof plate 18 is made of the same material as the lens element 16. Moreover, the dust-proof plate 18 is arranged between the light source 10 and the lens element 16. That is, the dust-proof plate 18 is arranged in the range of the first optical path length. In the apparatus of structured light generation 2, the lens unit 24 constructs a second optical path length for the light beam from the light source 10. Since the refraction index of the dust-proof plate 18 is different from that of air, the second optical path length is different from the first optical path length. The object of the lens element is not relevant to the imaging purpose of the general optical imaging device. That is, although the arrangement of the dust-proof plate or any other appropriate medium can generate the different optical path length, the lens element of this embodiment is suitably to generate two different optical path lengths. After the light beam is converted into a linear light beam by the lens element, a structured light is outputted from the apparatus of structured light generation 2. Consequently, the light beam is effectively shaped. Generally, the optical path length is the product of a working distance of the light and the refraction index of the medium. In accordance with the present invention, the difference between the working distances of the two or more optical path lengths is preferably smaller than 1 mm.

Figure 5:
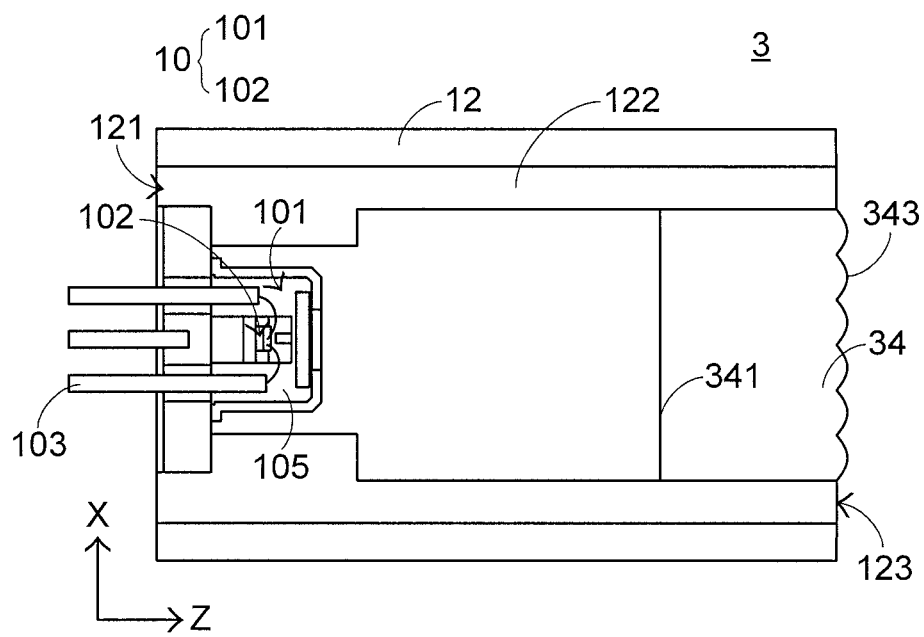
FIG. 5 is a schematic cross-sectional side view illustrating an apparatus of structured light generation according to a third embodiment of the present invention.

FIG. 5 is a schematic cross-sectional side view illustrating an apparatus of structured light generation according to a third embodiment of the present invention. In this embodiment, the lens unit 34 of the apparatus of structured light generation 3 includes a lens element. Like the second surface 143' of the first embodiment as shown in FIG. 2, a lenticular lens array structure is formed on the second surface 343 of the lens element. Similarly, the lens element of the apparatus of structured light generation 3 of this embodiment has a first surface 341 facing the light source 10. However, in comparison with the apparatus of structured light generation of the first embodiment as shown in FIG. 2, the first surface 341 of the lens element of this embodiment is a flat surface with a diffracting function. The lens unit 34 is also capable of generating a first optical path length. In this embodiment, the first surface 341 with the diffracting function has a phase distribution given by the following formula:

$$\phi(r) = dor \frac{2\pi}{\lambda_0}(df0 + df1r^2 + df2r^4 + df3r^6 + df4r^8 + \cdots)$$

where, $r^2 = x^2 + y^2$.

In the above formula, $\phi(r)$ is the phase distribution, r is the distance between any point and a center of the first surface 341, and x and y are two coordinates of two axes vertical to the optical axis (i.e. the Z axis). Preferably, the corresponding coefficients include: dor=1, df0 =0.0, df1=−6.1691×10^(−1), df1=2.8442×10^1, df3=−4.8405×10^3, df4=2.800× 10^5, df5=4.6892×10^(−2), and df6=3.1385×10^(−4).

Figure 6:
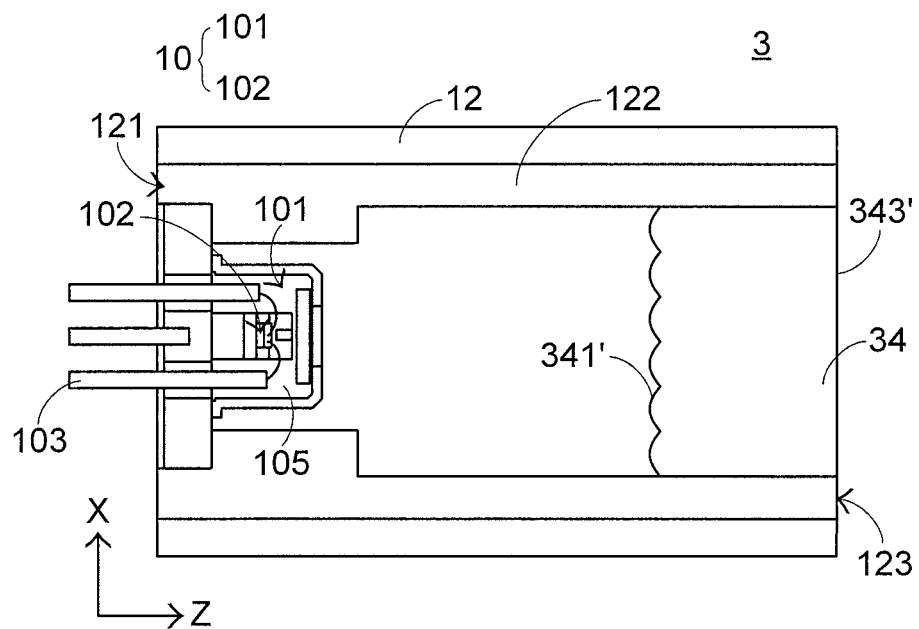
FIG. 6 is a schematic cross-sectional side view illustrating a variant example of the apparatus of structured light generation according to the third embodiment of the present invention.

It is noted that numerous modifications and alterations may be made while retaining the teachings of the invention. For example, the profiles of the first surface and the second surface of the lens element may be exchanged. FIG. 6 is a schematic cross-sectional side view illustrating a variant example of the apparatus of structured light generation according to the third embodiment of the present invention. As shown in FIG. 6, a lenticular lens array structure is formed on the first surface 341' of the lens element that faces the light source 10, and the second surface 343' of the lens element is a flat surface.

Figure 7:
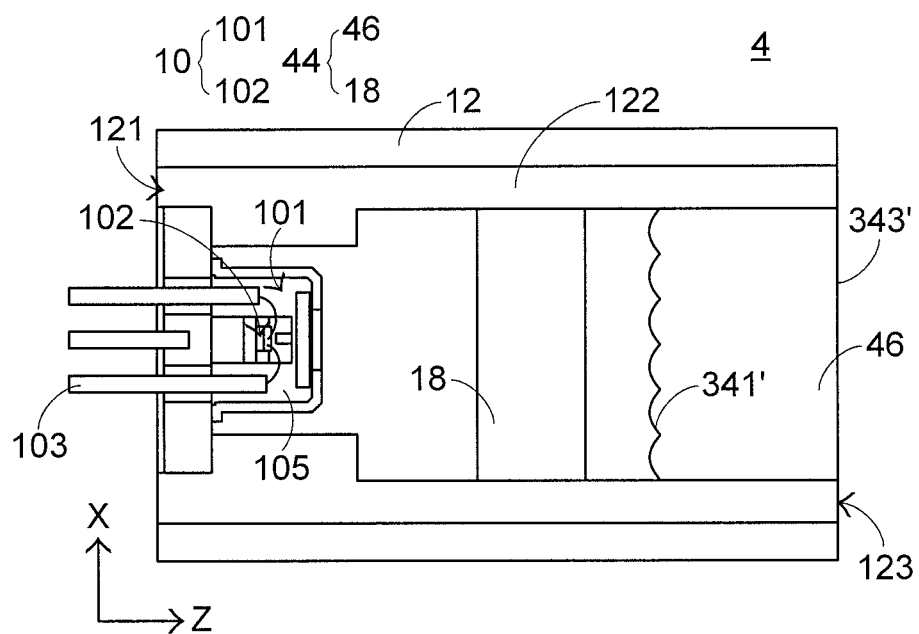
FIG. 7 is a schematic cross-sectional side view illustrating an apparatus of structured light generation according to a fourth embodiment of the present invention.

FIG. 7 is a schematic cross-sectional side view illustrating an apparatus of structured light generation according to a fourth embodiment of the present invention. In comparison with the apparatus of structured light generation of the third embodiment as shown in FIG. 6, the apparatus of structured light generation 4 of this embodiment further includes a dust-proof plate 18. The dust-proof plate 18 is arranged between the light source 10 and the lens element 46 of the lens unit 44. The lens element 46 of the apparatus of structured light generation 4 of this embodiment is equivalent to the lens unit 34 of the third embodiment. As mentioned above, by the arrangement of the lens unit 44 (or the lens element 46), the apparatus of structured light generation is suitably to generate two different optical path lengths. Moreover, the concepts of the present invention is applied to the situation where the light source 10 has plural light-emitting chips to result in different work distances as long as the difference between any two working distances is smaller than 1.2 mm.

Figure 8:
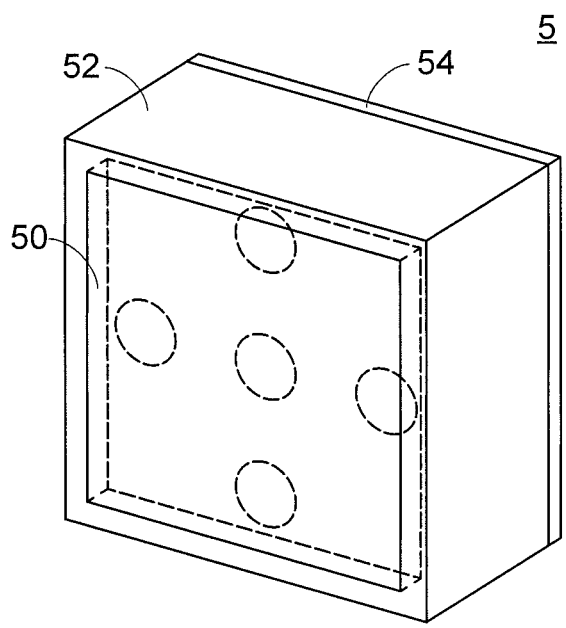
FIG. 8 is a schematic perspective view illustrating an apparatus of structured light generation according to a fifth embodiment of the present invention.
Figure 9:
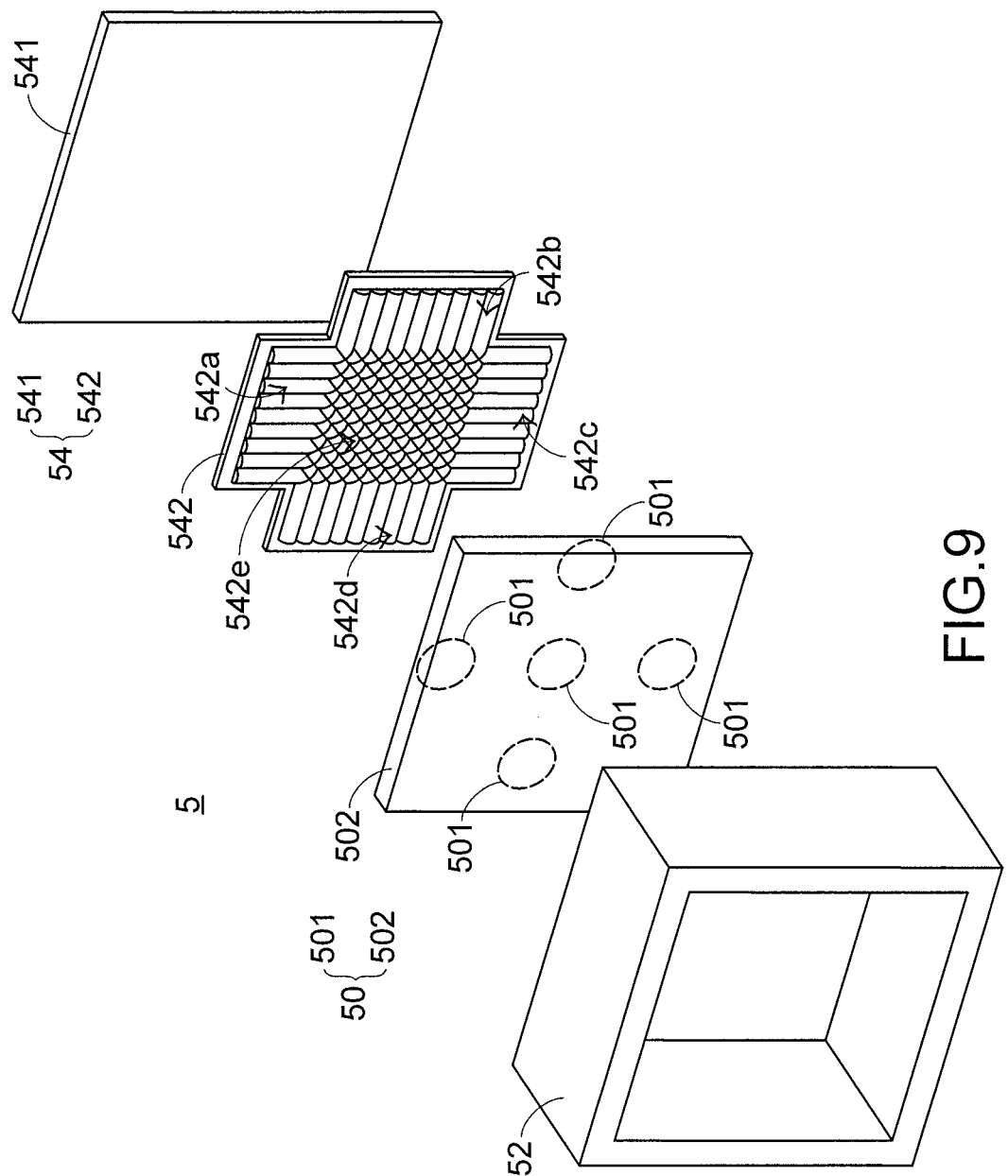
FIG. 9 is a schematic exploded view illustrating the apparatus of structured light generation according to the fifth embodiment of the present invention.
Figure 10:
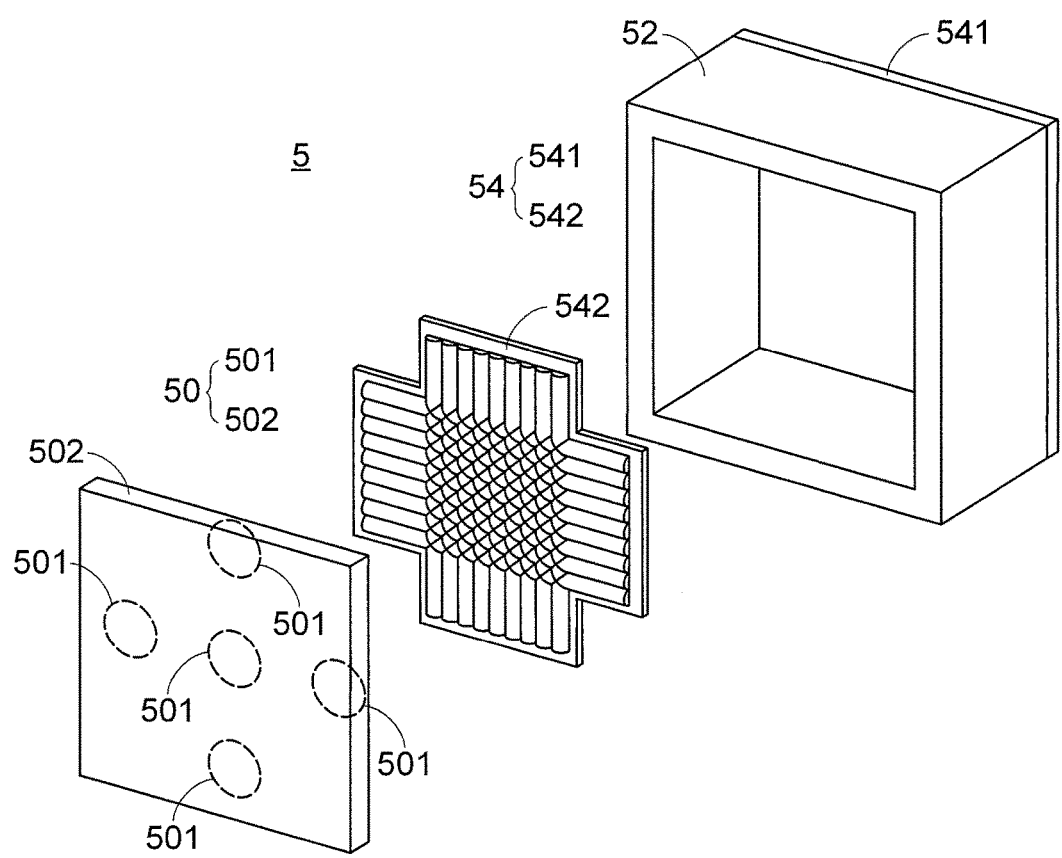
FIG. 10 is a schematic exploded view illustrating a variant example of the apparatus of structured light generation according to the fifth embodiment of the present invention.
Figure 11:
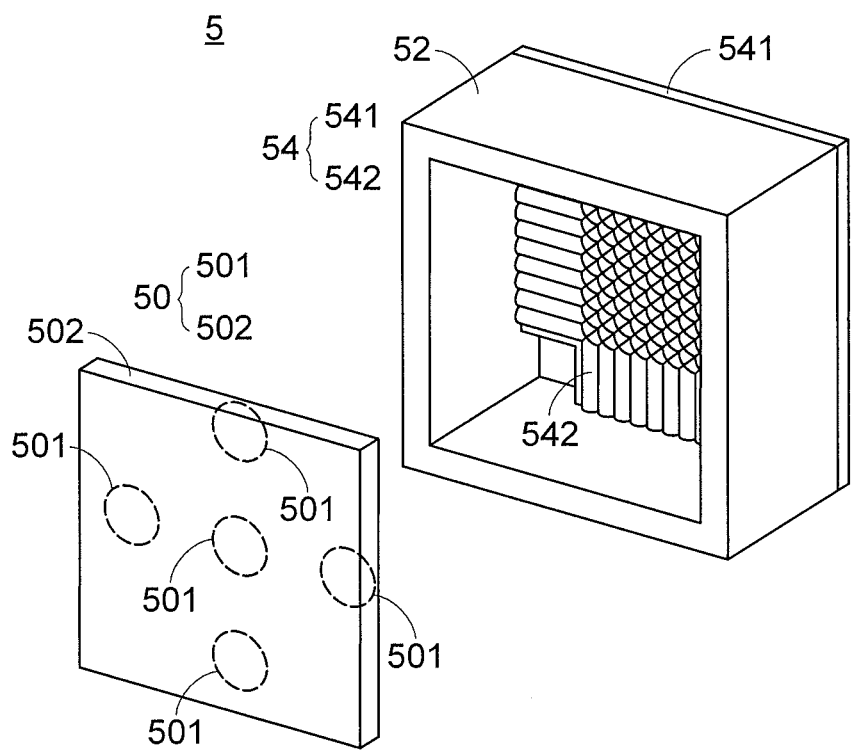
FIG. 11 is a schematic exploded view illustrating another variant example of the apparatus of structured light generation according to the fifth embodiment of the present invention.

Please refer to FIGS. 8~11. FIG. 8 is a schematic perspective view illustrating an apparatus of structured light generation according to a fifth embodiment of the present invention. FIG. 9 is a schematic exploded view illustrating the apparatus of structured light generation according to the fifth embodiment of the present invention. FIG. 10 is a schematic exploded view illustrating a variant example of the apparatus of structured light generation according to the fifth embodiment of the present invention. FIG. 11 is a schematic exploded view illustrating another variant example of the apparatus of structured light generation according to the fifth embodiment of the present invention. In this embodiment, the apparatus of structured light generation 5 includes a light source 50, a housing 52 and a lens unit 54. The light source 50 includes plural light-emitting chips 501. The plural light-emitting chips 501 are distributed on a circuit substrate 502. The light-emitting chips 501, the circuit substrate 502 and the lens unit 54 are accommodated within the housing 52. In this embodiment, the lens unit 54 is a lens group comprising more than two lens elements. The lens group includes a first lens element 541 and a second lens element 542. The second lens element 542 includes plural light-transmissible regions 542a~542e. The second lens element 542 may be considered as a mixed type optical structure. The light-transmissible regions 542a~542e of the second lens element 542 are located in the optical paths of the light beams from the light-emitting chips 501. Especially, the light-transmissible regions 542a~542e are aligned with the corresponding light-emitting chips 501 in a one-by-one arrangement. In this embodiment, the apparatus of structured light generation 5 includes five light-emitting chips and five light-transmissible regions. The shapes of the inner surfaces of the light-transmissible regions 542a~542e (i.e., the surfaces facing the light source) are independent from each other. After the light beams from the light-emitting chips 501 pass through the corresponding light-transmissible regions 542a~542e of the second lens element 542, each of the light beams is converted into at least one linear light beam by the corresponding light-transmissible regions 542a~542e. These linear light beams are projected out to generate a desired structured light pattern according to the demand of the designer. Moreover, these linear light beams are locally overlapped, globally overlapped, or not overlapped. In some embodiments, the light-emitting chips 501 are programmed to be individually turned on or turned off in the identical or different time segments.

It is noted that the mixed type optical structure is not restricted to the second lens element 542 of the lens unit 54. For example, in some other embodiments, the mixed type optical structure contains a diffractive structure, a reflective structure and/or a refractive structure.

In this embodiment, lenticular lens array structures are formed on the inner surfaces of the corresponding light-transmissible regions 542a, 542b, 542c and 542d, and a lenticular lens array structure along two orthogonal directions is formed on the inner surface of the light-transmissible region 542e. The profiles of the inner surfaces of the above light-transmissible regions are presented herein for purpose of illustration and description only. It is noted that the lenticular lens array structures on the inner surfaces of the light-transmissible regions may be arranged along different directions or have different tilt angles.

In this embodiment, the housing 52 has a shape of a rectangular sleeve, and the circuit substrate 502 and the first lens element 541 have the shapes of rectangular plates. It is noted that numerous modifications and alterations may be made while retaining the teachings of the invention. In the variant example of FIG. 10, the housing 52 and the first lens element 541 are integrally formed with each other by an injection molding process or combined together by any other appropriate means. In the variant example of FIG. 11, the housing 52, the first lens element 541 and the second lens element 542 are integrally formed with each other by an injection molding process or combined together by any other appropriate means. As a result, the process of fabricating the apparatus of structured light generation 5 is simplified and time-saving.

Figure 12:
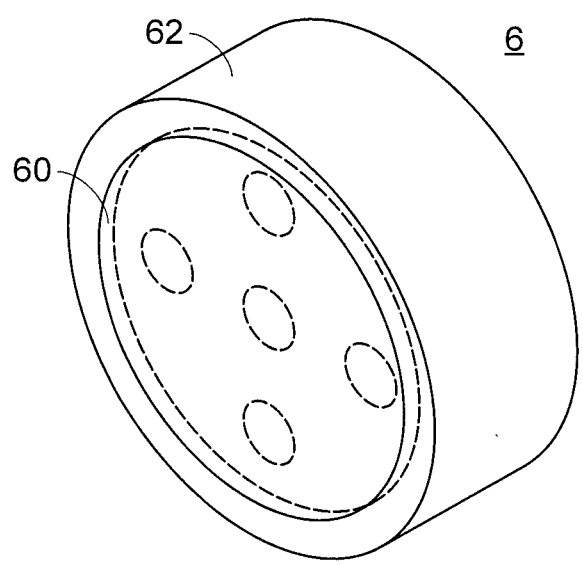
FIG. 12 is a schematic perspective view illustrating an apparatus of structured light generation according to a sixth embodiment of the present invention.
Figure 13:
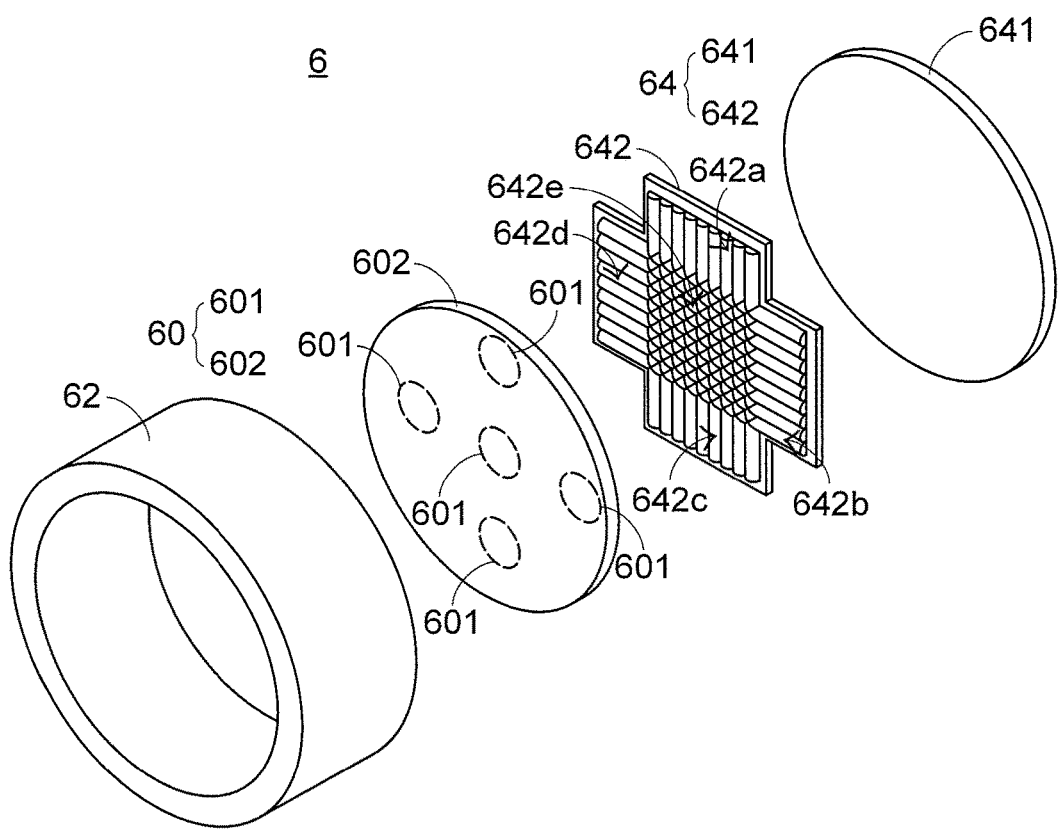
FIG. 13 is a schematic exploded view illustrating the apparatus of structured light generation according to the sixth embodiment of the present invention.

Please refer to FIGS. 12 and 13. FIG. 12 is a schematic perspective view illustrating an apparatus of structured light generation according to a sixth embodiment of the present invention. FIG. 13 is a schematic exploded view illustrating the apparatus of structured light generation according to the sixth embodiment of the present invention. Like the fifth embodiment, the apparatus of structured light generation 6 of the sixth embodiment includes a light source 60, a housing 62 and a lens unit 64. The light source 60 includes plural light-emitting chips 601. The plural light-emitting chips 601 are distributed on a circuit substrate 602. The light-emitting chips 601, the circuit substrate 602 and the lens unit 64 are accommodated within the housing 62. In this embodiment, the lens unit 64 is a lens group comprising more than two lens elements. The lens group includes a first lens element 641 and a second lens element 642. The second lens element 642 includes plural light-transmissible regions 642a~642e. The light-transmissible regions 642a~642e of the second lens element 642 are located in the optical paths of the light beams from the light-emitting chips 601. Especially, the light-transmissible regions 642a~642e are aligned with the corresponding light-emitting chips 601 in a one-by-one arrangement. The shapes of the inner surfaces of the light-transmissible regions 642a~642 e (i.e., the surfaces facing the light source) are independent from each other. In comparison with the fifth embodiment, the housing 62 of the sixth embodiment has a shape of a circular sleeve, and the circuit substrate 602 and the first lens element 641 of the sixth embodiment have the shapes of circular plates.

From the above descriptions, the present invention provides the apparatus of structured light generation. In the apparatus of structured light generation, the lens element with the functions of simultaneously collimating and shaping the light beam is used as the basic element of the lens unit. Consequently, the apparatus of structured light generation can be applied to an optical system with at least two optical path lengths in order to generate the infrared structured light. The optical path length is composed of one or plural working distances. The plural working distances may be identical or different as long as the difference between the working distances is smaller than 1.0 mm. In other words, the optical system with the apparatus of structured light generation of the present invention is more flexible to be conveniently operated by the user. Since the apparatus of structured light generation of the present invention has a compact size, the apparatus of structured light generation is suitably installed in the slim type mobile phone. Consequently, regardless of whether the apparatus of structured light generation is installed on a front side or a rear side of the mobile phone, the mobile phone has the function of generating the structured light.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An apparatus of structured light generation, comprising:
    a light source emitting a light beam;
    a lens unit converting the light beam into a linear light beam; and
    a housing accommodating the light source and the lens unit, wherein the housing comprises a first side and a second side, wherein the first side and the second side are opposed to each other and open to an outside of the casing, a distance between the first side and the second side is not larger than 4 mm, the light source is located near the first side, and the lens unit is located near the second side,
    wherein within the housing, the lens unit constructs a first optical path length and a second optical path length for the light beam, wherein the first optical path length and the second optical path length are different.

2. The apparatus of structured light generation according to claim 1, wherein the lens unit comprises a lens element, and a radius of a first surface of the lens element is larger than 0.189 mm, wherein the first surface faces the light source, and the first surface is an aspheric surface or has a lenticular lens array structure, wherein the first surface has an effective focal length smaller than 1.2 mm.

3. The apparatus of structured light generation according to claim 2, wherein a second surface of the lens element is an aspheric surface or has a lenticular lens array structure, and the second surface of the lens unit is close to the second side of the housing and faces the outside of the housing.

4. The apparatus of structured light generation according to claim 3, wherein the lens unit further comprises a dust-proof plate between the light source and the lens element.

5. The apparatus of structured light generation according to claim 1, wherein the lens unit comprises a lens element, wherein a first surface of the lens element is a flat surface with a diffracting function, and the first surface has a phase distribution given by a formula:

$$\phi(r) = dor \frac{2\pi}{\lambda_0}(df0 + df1r^2 + df2r^4 + df3r^6 + df4r^8 + \cdots)$$

where, $r^2 = x^2 + y^2$,
wherein $\phi(r)$ is the phase distribution, r is the distance between any point and a center of the first surface, and x and y are two coordinates of two axes vertical to an optical axis or a Z axis, wherein dor=1, df0=0.0, df1=−6.1691×10^(−1), df1=2.8442×10^1, df3=−4.8405×10^3, df4=2.800×10^5, df5=4.6892×10^(−2), and df6=3.1385×10^(−4).

6. The apparatus of structured light generation according to claim 2, wherein the light source comprises plural light-emitting chips, and the lens element comprises plural light-transmissible regions, wherein after the light beam from each of the light-emitting chips passes through the corresponding light-transmissible region of the lens element, the light beam is converted into at least one linear light beam by the corresponding light-transmissible region, wherein the linear light beams outputted from the plural light-transmissible regions are locally overlapped, globally overlapped, or not overlapped.

7. The apparatus of structured light generation according to claim 6, wherein the plural light-emitting chips are programmed to be individually turned on or turned off in identical or different time segments.

8. The apparatus of structured light generation according to claim 1, wherein the light source comprises one light-emitting chip, or the light source comprises plural light-emitting chips that are distributed on a curvy substrate.

* * * * *